United States Patent [19]

Huang et al.

[11] Patent Number: 5,429,988

[45] Date of Patent: Jul. 4, 1995

[54] PROCESS FOR PRODUCING HIGH DENSITY CONDUCTIVE LINES

[75] Inventors: Heng Sheng Huang, Taipei; Wood Wu, Chiu-pei; Kun-Luh Chen, Chu-nan, all of Taiwan

[73] Assignee: United Microelectronics Corporation, Hsinchu, Taiwan

[21] Appl. No.: 258,949

[22] Filed: Jun. 13, 1994

[51] Int. Cl.⁶ .................................. H01L 21/44
[52] U.S. Cl. .................................. 437/187; 437/193; 437/200; 437/245; 437/50
[58] Field of Search .............. 437/187, 984, 985, 186, 437/191, 50, 924, 193, 200, 228, 245; 148/DIG. 116, DIG. 117

[56] References Cited

U.S. PATENT DOCUMENTS

| 4,502,914 | 3/1985 | Trumpp et al. | 156/643 |
|---|---|---|---|
| 4,776,922 | 10/1988 | Bhattacharyya et al. | 156/643 |
| 5,236,853 | 8/1993 | Hsue | 437/43 |
| 5,310,693 | 5/1994 | Hsue | 437/43 |
| 5,328,810 | 7/1994 | Lowrey et al. | |
| 5,330,924 | 7/1994 | Huang et al. | 437/43 |

Primary Examiner—Olik Chaudhuri
Assistant Examiner—C. Everhart
Attorney, Agent, or Firm—George O. Saile

[57] ABSTRACT

A process of fabricating a semiconductor device on a substrate with closely spaced high density conductive lines is provided. A thin insulating layer is formed on the surface of a substrate. Next, a blanket conductive layer and a blanket masking layer are deposited over the first insulating layer. Using conventional photolithography processes and plasma etching, elongated spaced parallel masking lines with vertical sidewalls are formed in the masking layer. A blanket polycrystalline silicon layer is deposited on the masking lines and the exposed areas of the conductive layer. Next, the blanket polycrystalline silicon layer is anisotrophically etched to form spacers on the vertical sidewalls of the masking lines. A second planarized masking layer is formed over the spacers and masking lines. The polycrystalline silicon spacers and the underlying first polycrystalline silicon layer are anisotrophically etched to form the closely spaced conductive lines in the first polycrystalline silicon layer. A coating of electrically isolating material is formed between and over the conductive lines.

18 Claims, 3 Drawing Sheets

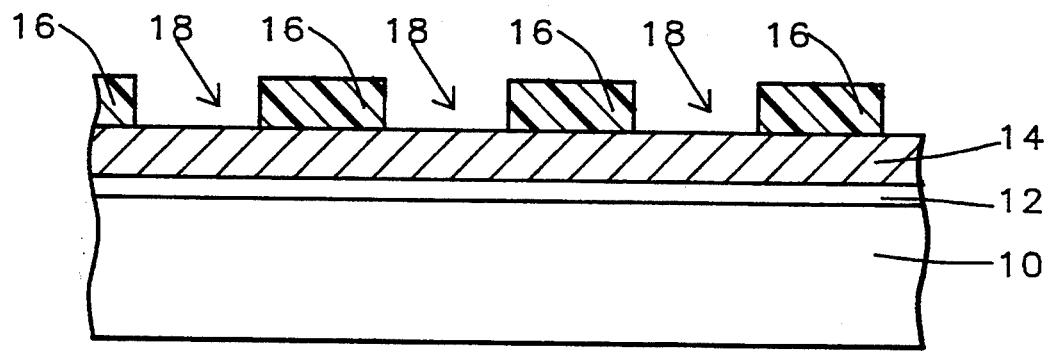
*FIG. 1 - Prior Art*
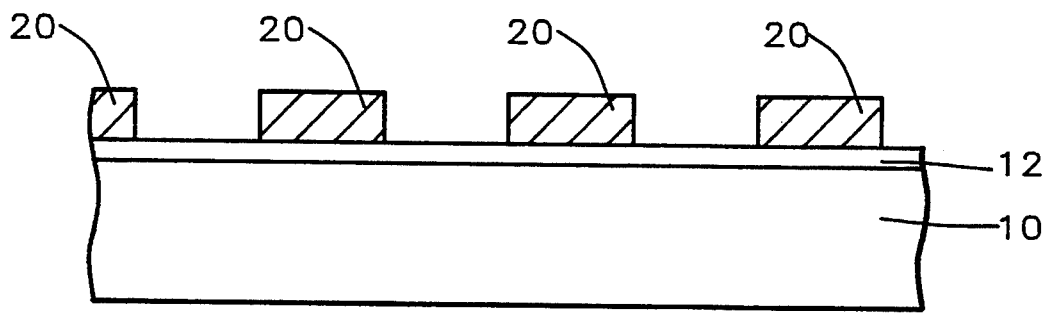
*FIG. 2 - Prior Art*
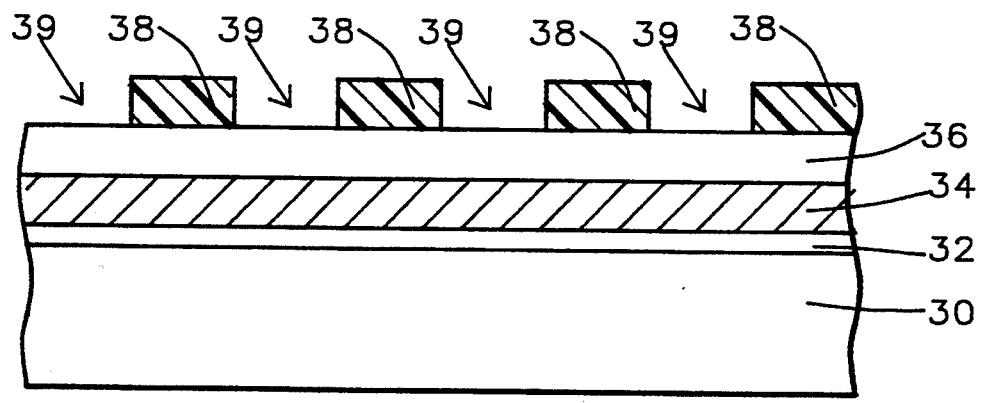
*FIG. 3*

PROCESS FOR PRODUCING HIGH DENSITY CONDUCTIVE LINES

BACKGROUND OF INVENTION (1) Field of the Invention

This invention relates to read only memory (ROM) type semiconductor devices and in particular, to an improved process for forming high density self-aligned conductive lines on a semiconductor substrate.

(2) Description of the Prior Art

In the quest to achieve microminiaturization of integrated circuit devices, individual elements have been made very small and the elements have been closely packed. Furthermore, as read only memory devices (ROM's) are scaled down in dimension, there is a continuous challenge to produce high density closely packed conductive lines using a minimum number of process steps. In producing read only memory devices, the maximum packing, or the minimum feature size, is determined by the photolithographic capability. Moreover, in the conventional prior art process for producing ROM's, the photolithographic capability is a limiting factor for determining the minimum conductive line width, pitch, and spacing.

In the conventional prior art process for ROM fabrication, shown in cross-sectional FIGS. 1 and 2, an insulating layer 12, typically oxide, is deposited on a monocrystalline silicon substrate 10. Subsequently, a blanket conductive layer 14, formed of doped polycrystalline silicon or a polycide layer, is deposited over the insulating layer 12. Next, photoresist layer 16 is deposited over the blanket conductive layer 14. The photoresist layer 16 is exposed and developed to form elongated openings 18 that define the spaces between the conductive lines. Next, referring to FIG. 2, the exposed conductive layer 14 is etched away to form the word lines 20. Subsequently, an insulating layer (not shown) is deposited in the space between the word lines. The process steps to complete the read only memory device (ROM) device are well known.

SUMMARY OF INVENTION

An object of the present invention is to provide a process of forming a memory device with high density conductive lines.

Another object of the present invention is to provide a process for fabricating a read only memory device (ROM) with very closely spaced conductive word lines.

Yet another object is to provide a plurality of closely spaced conductive lines where the spacings between the lines are smaller than the line widths.

In accordance with the above objects, a process for fabricating a semiconductor device on a monocrystalline substrate with closely spaced, high density conductive lines is provided. A thin insulating layer is formed on the surface of a monocrystalline semiconductor substrate, Next, a blanket conductive layer is deposited over the first insulating layer. The blanket conductive layer can be formed of doped polysilicon, ion implanted polysilicon or a refractory metal polycide. A refractory metal polycide can be formed of a combination of a polysilicon layer with an overlaying layer of a polycide, such as tungsten silicide ($WSi_2$). Next, a blanket masking layer is deposited over the polycrystalline silicon or polycide layer. Using conventional photolithography processes and plasma etching, elongated spaced parallel masking lines with vertical sidewalls are formed in the masking layer. A thin silicon oxide layer and a conformal polycrystalline silicon are deposited on the masking layer and the exposed first polycrystalline silicon layer. Next, the conformal polycrystalline silicon layer is anisotrophically etched to form spacers on the vertical sidewalls of the masking layer. A second blanket masking layer, having a planar top surface, is formed over the line pattern. Subsequently, the polycrystalline silicon spacers, the underlying thin oxide layer, and the underlying first polycrystalline silicon layer are anisotrophically etched to form the closely spaced conductive lines. Finally, a coating of electrically isolating material is formed between and over the conductive lines.

BRIEF DESCRIPTION OF THE DRAWINGS

The drawings show the following:

FIGS. 1 and 2 are a sequence of cross-sectional views in broken section in greatly enlarged scale that illustrate conductive parallel lines in various stages of fabrication in accordance with the prior art processes FIGS. 3 through 9 are a sequence of cross-sectional views in broken section in greatly enlarged scale that illustrate a device structure including very closely spaced conductive lines in various stages of fabrication in accordance with the process of the invention.

DETAILED DESCRIPTION OF THE PREFERRED EMBODIMENTS

Figure 4:
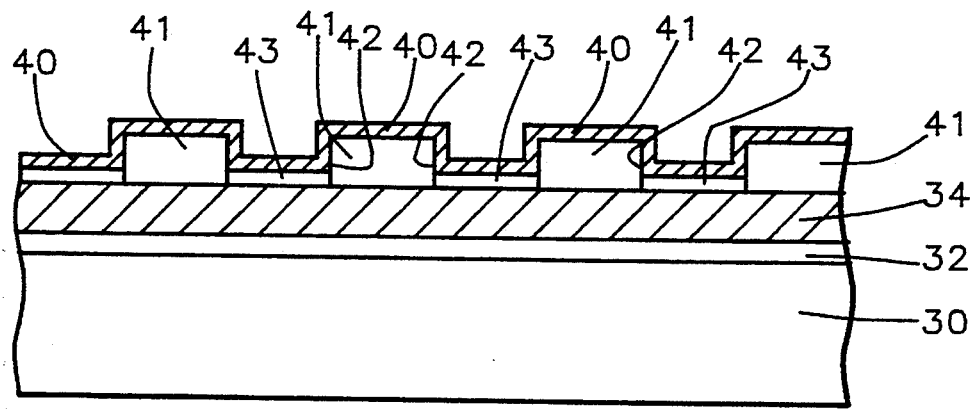

The present inventions will be described in detail with reference to the accompanying drawings. It should be noted that the drawings are in greatly simplified form. In practice the memory device structures have many closely spaced conductive lines connected with suitable metallurgy in various electronic electric circuit configurations. Referring to FIG. 3, the substrate 30 shall be a monocrystalline silicon semiconductor body with many devices fabricated therein, as is well known in the art. Thin insulating layer 32 preferably oxide, is formed on substrate 30. Suitable materials include silicon dioxide ($SiO_2$), silicon oxynitride (SiNO) or silicon nitride ($Si_3N_4$). Layer 32 typically has a thickness is in the range of 60 to 250 Angstroms, more preferably a thickness of 100 Angstroms.

Next a conductive layer 34, is formed over the insulating layer 32. The conductive layer 34 can be formed from doped polycrystalline silicon or a polycide such as a combination of a polycrystalline silicon and a refractory metal substance such as tungsten silicide ($WSi_2$). The conductive layer 34 typically has a thickness in the range of 1500 to 4000 Angstroms. Following this, a first blanket masking layer 36 is deposited over layer 34. Layer 36 is formed of a material that is resistant to a polycrystalline silicon etch process. Layer 36 has a thickness in the range of 100 to 1000 Angstroms and is preferably a material such as silicon dioxide ($SiO_2$), silicon oxynitride (SiNO) or silicon nitride ($Si_3N_4$). Layer 36 can typically be formed by thermal furnace growth, low pressure chemical vapor deposition (LPCVD) or atmospheric pressure chemical vapor deposition (APCVD) processes.

Subsequently, photoresist layer 38 is deposited over layer 36, exposed and developed to form elongated lines and openings 39. The width of openings 39 is approximately the same width as the lines 38. Masking lines 38 can have a width in the range of 0.3 to 0.6 micrometers.

As illustrated in FIG. 4, the exposed areas of masking layer 36 are anisotrophically etched to form masking lines 41 with vertical sidewalls 42. Anisotropic etching can be achieved by reactive ion etching with carbon tetrafloride ($CF_4$) and oxygen as the etching ambient as is well known.

Second thin insulating layer 43 is formed on the exposed areas of layer 34. Layer 43 is preferably composed of silicon dioxide ($SiO_2$) with a thickness in the range of 100 to 500 Angstroms (A). Layer 43 can be formed by conventional thermal oxidation processes at temperatures that range from 700° to 1200° C. Also, layer 43 can be used as an etching end point and for protection of layer 34 in the dry etch process.

A thin conformal polycrystalline silicon layer 40 is deposited over masking lines 41, vertical side walls 42 of the masking lines and thin insulating layer 43. The polycrystalline silicon layer 40 has a thickness in the range of 1000 to 3000 Angstroms (A). Layer 40 is typically formed by low pressure chemical vapor deposition (LPCVD) at approximately 620° C.

Figure 5:
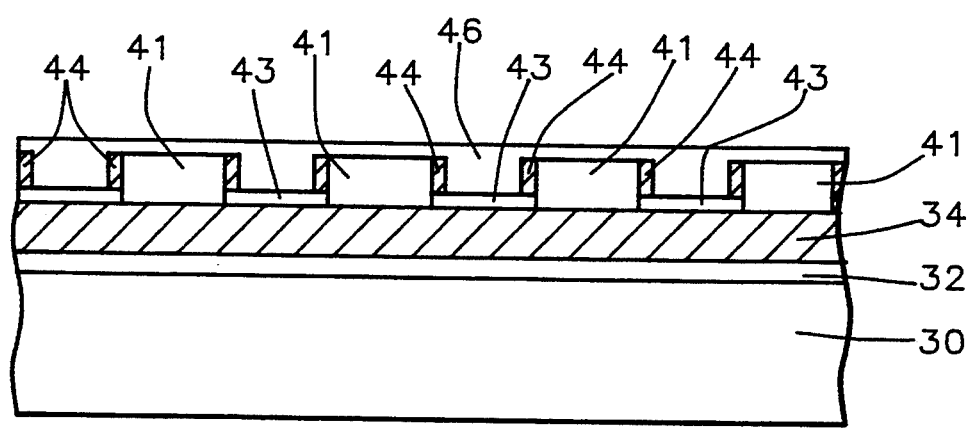

Next, referring to FIG. 5, the polycrystalline silicon layer 40 is anisotrophically etched to form spacers 44 on the vertical sidewalls 42 of the masking layer 36. Layer 40 can be etched using a reactive ion etch, Now, a second masking layer 46, having a planar top surface, is formed over the substrate surface. The planar masking layer 46 has a thickness greater than the insulating layer 36 and is in the range of 3000 to 6000 Angstroms.

Layer 46 can be formed of borophososilicate glass (BPSG) or silicon oxide, Several methods can be used. First, the borophososilicate glass (BPSG) masking layer 46 can be formed by low pressure chemical vapor deposition (LPCVD) at 650° to 750° C. using tetraethylorthosilicate (TEOS) as a source. In this process, boron and phosphorus are added to the ambient during the formation of the borophososilicate glass layer. The layer 46 is thermally treated at approximately a temperature of 850° C. for 30 minutes to cause flow and planarization.

Second, a silicon oxide masking layer 46 can be deposited at 650° to 750° C. in a low pressure chemical vapor deposition reactor by decomposing tetraethoxysilane, $Si(OC_2H_5)_4$ (TEOS). Alternately, layer 46 can a formed using a spin on glass (SOG), preferably a siloxane, which is deposited, baked and: cured at approximately 400° C. Yet another method of forming layer 46 is making a three layer sandwich structure of (a) silicon oxide, (b) spin on glass and (c) silicon oxide. An underlying silicon oxide is deposited by a plasma enhanced chemical vapor deposition (PECVD), followed by deposition of an intermediate layer of spin on glass (as described above), and followed by a top silicon oxide layer deposited by plasma enhanced chemical vapor deposition (PECVD). Silicon dioxide can be deposited using PECVD by reacting silane and nitrous oxide in an argon plasma at 200° to 350° C.

Figure 6:
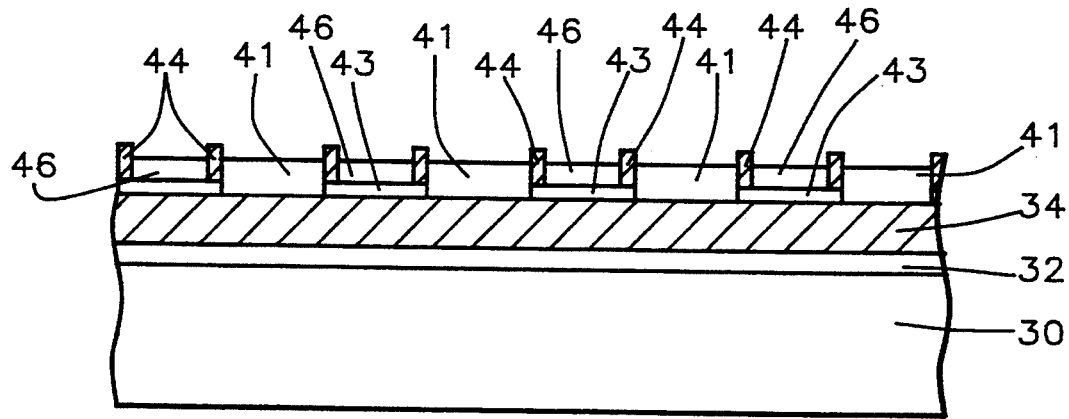
Figure 7:
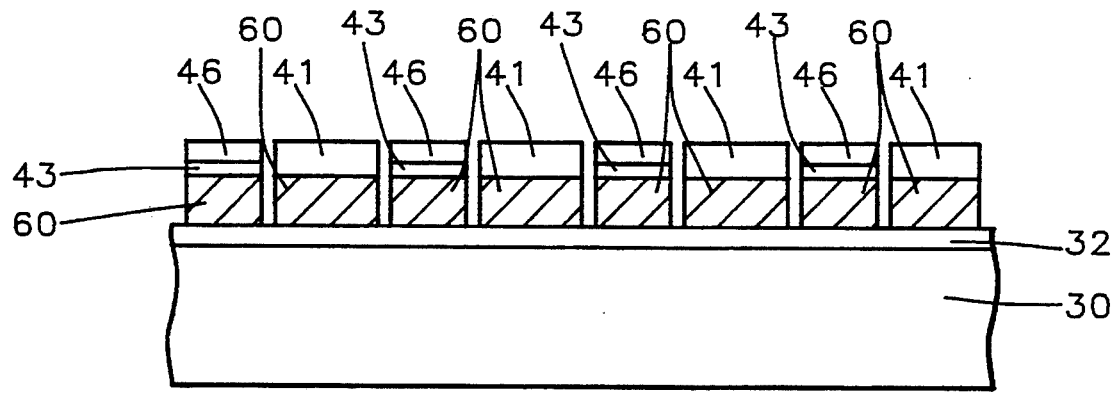
Figure 8:
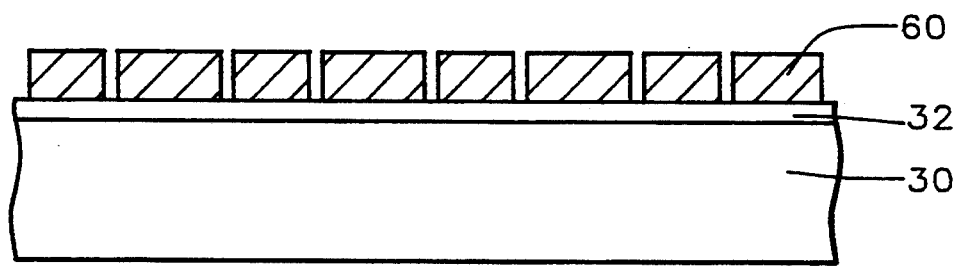
Figure 9:
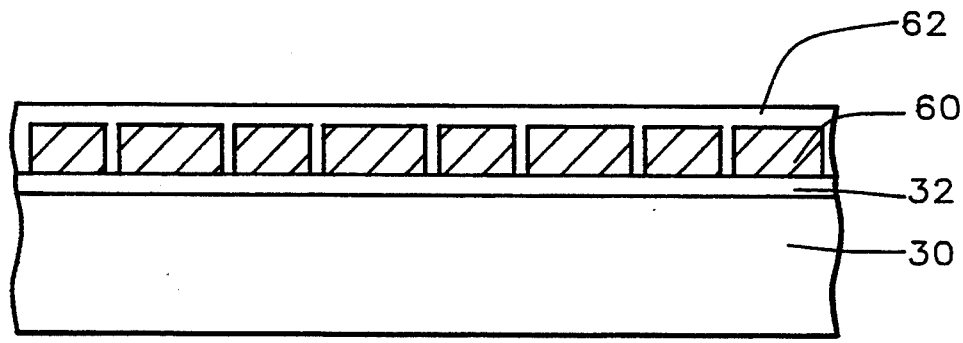

As shown in FIG. 6, the planar masking layer 46 is etched back to expose the top of the spacers 44 and the masking lines 41. Referring to FIG. 7, the spacers 44, underlying portions of layer 43 and the underlying polycrystalline layer 34, are anisotropically etched to form the narrowly spaced conductive lines 60. As FIG. 8 illustrates, the masking layers 41, 46 are etched away. FIG. 9 shows the subsequent forming of insulating layer 62 over and between the conductive lines 60.

To complete the ROM device, suitable electrical connections are made to the conductive lines and connections are made to the associated circuitry on the device as is well known in the art. The device also includes buried diffused bit lines that are orthogonal to the conductive lines. The bit lines are not shown in the FIGS. and are conventional.

With this process under the constrain of a given photolithography resolution capacity, the conductive lines and associated spacing can be made smaller than can be achieved with the conventional process as described in the prior art section. For example, with a 0.6 micron photolithography resolution capacity, using the conventional process, an achievable word line pitch is 1.2 microns. Word line pitch is defined as the distance of the width of one word line plus the width of the associated space. For the same 0.6 micron photolithography resolution capacity, with the subject process, a word line pitch of approximately 0.7 microns (or approximately 120% of the resolution capacity) can be achieved.

While the invention has been particularly shown and described with reference to the preferred embodiments thereof, it will be understood by those skilled in the art that various changes in form and details may be made without departing from the spirit and scope of the invention.

What is claimed is:

1. A method of forming a plurality of self-aligned closely spaced conductive lines on a semiconductor substrate comprising the steps of:

providing a first thin insulating layer on the surface the semiconductor substrate, forming a blanket conductive layer over the first insulating layer, depositing a first blanket masking layer over the blanket conductive layer, depositing a photoresist layer over the masking layer, exposing and developing the photoresist layer to define an elongated spaced parallel line pattern which exposes areas of the first masking layer between the line pattern, anisotrophically etching the exposed areas of said first masking layer through the photoresist pattern to form masking lines having vertical sidewalls and exposing areas of the conductive layer between the line patterns, removing the photoresist pattern, thermally oxidizing the exposed areas of the conductive layer between the masking lines forming a second thin insulating layer, depositing a conformal layer of polycrystalline silicon material over said masking lines and the thermal oxide, anisotrophically etching the conformal layer of polycrystalline silicon to form spacers on the vertical sidewalls of the said masking lines, depositing a second masking layer having a planar top surface over the masking lines to thickness greater than the thickness of the masking lines.

planarized etching the second masking layer to expose the top surfaces of the masking lines and spacers.

anisotropically etching said polycrystalline silicon spacers and etching through the underlying second insulating layer and the underlying conductive layer thereby forming closely spaced conductive lines, removing the masking lines of the first masking layer and said second masking layer, forming an insulating layer over said conductive lines of the conductive layer.

2. The method of claim 1 wherein said first thin insulating layer is a thermal silicon oxide layer having a thickness in the range of 60 to 250 Angstroms.

3. The method of claim 1 wherein said conductive layer has a thickness in the range of 1500 to 4000 Angstroms.

4. The method of claim 1 wherein said conductive layer is formed of polycrystalline silicon material.

5. The method of claim 1 wherein said conductive layer is formed of polycide.

6. The method of claim 5 wherein said polycide is a combination of polycrystalline silicon and an overlying layer of tungsten silicide.

7. The method of claim 1 wherein said first blanket masking layer is formed of a material selected from the group consisting of: silicon oxide, silicon oxynitride or silicon nitride and mixtures thereof.

8. The method of claim 7 wherein the first blanket masking layer thickness has a range of 100 to 1000 Angstroms.

9. The method of claim 1 wherein said masking lines each having a width in the range of 0.3 to 0.6 micrometers.

10. The method of claim 1 wherein the anisotropic etching of said first masking layer is achieved by reactive ion etching with timed or end point control.

11. The method of claim 1 wherein conformal layer of polycrystalline silicon material is formed by low pressure chemical vapor deposition at 620° C.

12. The method of claim 11 wherein the conformal layer of polycrystalline silicon material has a thickness in the range of 1000 to 3000 Angstroms.

13. The method of claim 1 wherein anisotrophically etching the second polycrystalline silicon layer is achieved by a reactive ion etch.

14. The method of claim 1 wherein the second masking layer deposited over the line pattern has a thickness in the range of 3000 to 6000 Angstroms over the second thin insulating layer.

15. The method of claim 1 wherein the second masking layer is formed of a material selected from the group consisting of: borophososilicate glass, silicon oxide or spin on glass, and mixtures thereof.

16. The method of claim 1 wherein the second masking layer is a three layer sandwich structure consisting of a silicon oxide layer deposited by plasma enhanced chemical vapor deposition, a spin on glass layer and silicon oxide layer deposited by plasma enhanced chemical vapor deposition.

17. The method of claim 1 wherein the word line pitch of the closely spaced conductive lines is on the order of 120% of the photolithographic resolution capacity.

18. The method of claim 1 wherein the word pitch of the closely spaced conductive lines is on the order of 0.7 microns when the photolithographic resolution limit is 0.6 microns.

* * * * *